United States Patent
Song et al.

(10) Patent No.: US 10,482,955 B2
(45) Date of Patent: Nov. 19, 2019

(54) STORAGE ARRAY, AND STORAGE CHIP AND METHOD FOR STORING LOGICAL RELATIONSHIP OF OBJECTS

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Sannian Song, Shanghai (CN); Xiaogang Chen, Shanghai (CN); Zhitang Song, Shanghai (CN); Tianqi Guo, Shanghai (CN)

(73) Assignee: SHANGHAI INSTITUTE OF MICROSYSTEM AND INFORMATION TECHNOLOGY, CHINESE ACADEMY OF SCIENC, Changning District, Shanghai (CN)

( * ) Notice: Subject to any disclaimer, the term of this patent is extended or adjusted under 35 U.S.C. 154(b) by 0 days.

(21) Appl. No.: 15/739,883

(22) PCT Filed: Dec. 24, 2015

(86) PCT No.: PCT/CN2015/098732
§ 371 (c)(1),
(2) Date: Jun. 22, 2018

(87) PCT Pub. No.: WO2017/101143
PCT Pub. Date: Jun. 22, 2017

(65) Prior Publication Data
US 2018/0322919 A1    Nov. 8, 2018

(30) Foreign Application Priority Data
Dec. 18, 2015 (CN) .......................... 2015 1 0960374

(51) Int. Cl.
*G11C 11/00* (2006.01)
*G11C 13/00* (2006.01)
(Continued)

(52) U.S. Cl.
CPC ........ *G11C 13/0026* (2013.01); *G11C 7/1006* (2013.01); *G11C 11/54* (2013.01);
(Continued)

(58) Field of Classification Search
CPC ... G11C 13/0026; G11C 11/54; G11C 13/004; G11C 13/003; G11C 13/0023;
(Continued)

(56) References Cited

U.S. PATENT DOCUMENTS 6,731,535 B1 *  5/2004  Ooishi ................... G11C 11/16
                                                    257/E27.005
8,310,858 B2 *  11/2012  Ito ......................... G11C 5/147
                                                    365/148
(Continued)

FOREIGN PATENT DOCUMENTS

| CN | 101542632 A | 9/2009 |
|---|---|---|
| CN | 101783182 A | 7/2010 |

(Continued)

*Primary Examiner* — Tha-O H Bui
(74) *Attorney, Agent, or Firm* — Global IP Services; Tianhua Gu

(57) ABSTRACT

A storage array and a storage chip and method for storing a logic relationship between objects. The storage array comprises first leading-out wires and second leading-out wires, and a storage unit is connected between each first leading-out wire and each second leading-out wire having different serial numbers. A controllable switch is connected between each first leading-out wire and each second leading-out wire having a same serial number. The storage chip comprises an interface module. A control module is used for producing a control signal. A driving module is used for producing write (Continued)

current, erase current or read current. A first decoder and a second decoder are used for gating the first leading-out wires and the second leading-out wires. A storage array is used for storing a logic relationship value. The storage method comprises write and read operations.

11 Claims, 5 Drawing Sheets

(51) Int. Cl.
| | |
|---|---|
| H01L 27/10 | (2006.01) |
| H01L 27/24 | (2006.01) |
| H01L 45/00 | (2006.01) |
| G11C 7/10 | (2006.01) |
| G11C 11/54 | (2006.01) |

(52) U.S. Cl.
CPC ........ *G11C 13/003* (2013.01); *G11C 13/0004* (2013.01); *G11C 13/004* (2013.01); *G11C 13/0023* (2013.01); *G11C 13/0069* (2013.01); *H01L 27/101* (2013.01); *H01L 27/2409* (2013.01); *H01L 45/04* (2013.01); *G11C 2213/72* (2013.01); *G11C 2213/79* (2013.01); *H01L 45/06* (2013.01); *H01L 45/1233* (2013.01); *H01L 45/144* (2013.01)

(58) Field of Classification Search
CPC .............. G11C 7/1006; G11C 13/0069; G11C 13/0004; G11C 2213/72; G11C 2213/79; H01L 27/101; H01L 27/2409; H01L 45/04; H01L 45/144; H01L 45/1233; H01L 45/06
USPC ........................................................ 365/148
See application file for complete search history.

(56) References Cited

U.S. PATENT DOCUMENTS

| | | | |
|---|---|---|---|
| 2002/0196659 A1* | 12/2002 | Hurst | G11C 8/10 365/175 |
| 2004/0057271 A1* | 3/2004 | Parkinson | G11C 13/0004 365/99 |
| 2012/0092921 A1 | 4/2012 | Ono et al. | |

FOREIGN PATENT DOCUMENTS

| | | |
|---|---|---|
| CN | 102750980 A | 10/2012 |
| JP | 2006302407 A | 11/2006 |
| JP | 2013054807 A | 3/2013 |

\* cited by examiner

STORAGE ARRAY, AND STORAGE CHIP AND METHOD FOR STORING LOGICAL RELATIONSHIP OF OBJECTS

CROSS REFERENCE TO RELATED PATENT APPLICATION

The present application is the US national stage of PCT/CN2015/098732 filed on Dec. 24, 2015, which claims the priority of the Chinese patent application No. CN201510960374.2 filed on Dec. 18, 2015, which application is incorporated herein by reference.

TECHNICAL FIELD

The present invention relates to the field of semiconductor storage integrated circuits, and in particular to a storage array and a storage chip and method for storing a logic relationship between objects.

BACKGROUND

After decades of development, computer storage systems have already formed complete hierarchical structures. Technologies such as SRAMs, DRAMs, FLASH, EEPROMs and magnetic medium storage have respective positions in hierarchical structures according to different performance, so as to guarantee that a computing core has enough data for use during high-speed operation. Although performance and storage principles of various storage mediums are different, functions thereof are consistent, i.e., storing data to designated addresses and guaranteeing that the original data can be read out for use if the data are needed.

With the sharp increase of storage demands, processing capabilities of CPUs are enhanced stably with Moore' Law, construction scales of data centers become larger and larger, and consequently energy use costs gradually become the largest expenses of data centers. On the other hand, the expansion of data scales makes it more difficult to acquire useful information from data. Under this situation, numerous companies and researchers are focusing on neural networks of brains.

Human brains process a great amount of information by various means such as visual senses, auditory senses and tactile senses, and have matchless capabilities in aspects such as reasoning, recognition, association and prediction as compared with computer systems. However, as estimated, the power consumption of an adult brain is only about 20 W, and transmission speed of information in the brain can only reach a magnitude of milliseconds. The problem is how to improve operation modes of computer systems by obtaining an inspiration from the working modes of human brains to achieve the purpose of high-efficiency and low-power-consumption operation.

Neural network computation has already formed a very mature and complete theoretical system. Parallel processing mechanisms of neural networks of brains are imitated to form a multi-input multi-output system. This system has a more accurate prediction capability through the training of a great amount of data, and is realized in computer software in the beginning. In order to improve computing efficiency, more hardware systems realize hardware acceleration of algorithms through technologies such as processors and FPGAs (Field Programmable Gate Arrays). Further, IBM had launched an artificial Intelligence Watson computer system project many years ago, and led the research and development of the field of intelligent processing chips.

In the direction of imitating brains or imitating neural networks the research progress on storage technologies is much slower than computing technologies, and there is a long distance between the memory principle of human brain and the storage mode of computers. A fundamental difference lies in that human brains use objects and a logic relationship between objects as main memory content, but the capability in memorizing original information data such as images, sounds and characters is very weak. As a result, the thinking mode of human brains is greatly different from the computing mode of computers. After new storage technologies represented by phase change storage technology emerge, especially since the new storage technologies are based on resistive storage which not only is a nonvolatile storage technology but also supports high-speed random access, keen researchers have already started to try to manufacture storage chips which are closer to human brain memory by using these new technologies, expecting to realize application in the brain imitation or artificial intelligence field.

SUMMARY

In view of the above-mentioned disadvantages in the prior art, the purpose of the present invention is to provide a storage array and a storage chip and method for storing a logic relationship between objects so as to solve the problem of storage demand increase in the prior art.

In order to realize the above-mentioned purpose and other related purposes, the present invention provides a storage array. The storage array at least comprises:

first leading-out wires and second leading-out wires which have the same quantity and are respectively located in a line direction and a column direction; the first leading-out wires and the second leading-out wires being respectively numbered; a storage unit being connected between each first leading-out wire and each second leading-out wire having different serial numbers; and a controllable switch being connected between each first leading-out wire and each second leading-out wire having a same serial number; wherein, the storage unit comprises a variable-resistance two-terminal device and a gating diode which are connected in series; and the gating diode is forwardly conducted from the first leading-out wire to the second leading-out wire and is reversely cut off from the second leading-out wire to the first leading-out wire; and the controllable switch is switched between a bidirectional cut-off state and a unidirectional conducted state from the second leading-out wire to the first leading-out wire.

Preferably, the variable-resistance two-terminal device is capable of changing between at least two resistance values under the effect of an electrical pulse signal.

Preferably, a resistance value of the variable-resistance two-terminal device is capable of changing between a maximum resistance value and a minimum resistance value under the effect of an electrical pulse signal according to different intensities and waveforms of electrical exciting signals, wherein the maximum resistance value is higher than the minimum resistance value by at least one magnitude.

In order to realize the above-mentioned purpose and other related purposes, the present invention further provides a storage chip for storing a logic relationship between objects. The storage chip for storing the logic relationship between objects at least comprises:

an interface module, a control module, a driving module, a first decoder, a second decoder and the storage array;

the interface module is used for inputting and outputting data;

the control module is connected with the interface module, the driving module and the first decoder, and is used for acquiring an input instruction and producing a corresponding control signal;

the driving module is connected with the control module and the second decoder, and is used for producing write current, erase current or read current according to the control signal output by the control module;

the first decoder is connected with the control module and the first leading-out wires of the storage array, and is used for gating the corresponding first leading-out wire under the control of the control module;

the second decoder is connected with the driving module and the second leading-out wires of the storage array, and is used for gating the corresponding second leading-out wire under the control of the control module; and the storage array is respectively connected with the control module, the first decoder and the second decoder, and is used for turning off all controllable switches under the control of the control module and writing a logic relationship value into a storage unit between the gated first leading-out wire and the gated second leading-out wire; or turning on all controllable switches under the control of the control module and reading out a logic relationship value between the gated first leading-out wire and the gated second leading-out wire.

Preferably, the gated first leading-out wire represents a first object as a condition, and the gated second leading-out wire represents a second object as a result; the logic relationship value is a probability value that the second object is directly caused to be established when the first object is established, and the first leading-out wire and the second leading-out wire having a same serial number correspond to a same object.

In order to realize the above-mentioned purpose and other related purposes, the present invention further provides a storage method for storing a logic relationship between objects. The storage method for storing the logic relationship between objects adopts the above storage array and at least comprises the following steps:

write operation:

inputting information which needs to be written, including a first object, a second object and a logic relationship value between the first object and the second object;

turning off all controllable switches in the storage array;

gating a first leading-out wire corresponding to the first object and gating a second leading-out wire corresponding to the second object; and producing write current corresponding to the logic relationship value between the first object and the second object, and applying the write current to a storage unit between the gated first leading-out wire and the gated second leading-out wire; and read operation:

inputting an object group having a relationship which needs to be read out, the object group comprising the first object and the second object;

turning on all controllable switches in the storage array;

gating the first leading-out wire corresponding to the first object and gating the second leading-out wire corresponding to the second object;

producing read voltage or current, applying the read voltage or current to the gated first leading-out wire and the gated second leading-out wire, and reading a resistance value between the gated first leading-out wire and the gated second leading-out wire; and converting the read resistance value into a corresponding logic relationship value and then outputting the logic relationship value.

Preferably, the first object is a condition, the second object is a result and the logic relationship value is a probability value that the second object is directly caused to be established when the first object is established.

Preferably, in the write operation, the written logic relationship value overwrites an original logic relationship value; or is superposed on the basis of an original logic relationship value to enhance a logic relationship between the first object and the second object.

Preferably, in the read operation, if the first object and the second object have a direct relationship, a resistance value corresponding to the logic relationship value between the first object and the second object is directly read out; if the first object and the second object have an indirect relationship through a third object, a sum of a resistance value corresponding to a logic relationship value between the first object and the third object and a resistance value corresponding to a logic relationship value between the third object and the second object is read out; and if the first object and the second object not only have a direct relationship but also have an indirect relationship through the third object, a resistance value obtained by connecting in series the resistance value corresponding to the logic relationship value between the first object and the third object with the resistance value corresponding to the logic relationship value between the third object and the second object and connecting with the resistance value corresponding to the logic relationship value between the first object and the second object in parallel is read out.

Preferably, in the write operation, a method for gating the second leading-out wire corresponding to the second object comprises: grounding the second leading-out wire corresponding to the second object, and suspending other second leading-out wires or applying a high level to other second leading-out wires to reversely cut off gating diodes in unselected storage units.

Preferably, in the read operation, a method for gating the second leading-out wire corresponding to the second object comprises: grounding the second leading-out wire corresponding to the second object and suspending other second leading-out wires.

As described above, the storage array and the storage chip and method for storing the logic relationship between objects provided by the present invention have the following beneficial effects:

The storage array and the storage chip and method for storing the logic relationship between objects provided by the present invention adopt an electrically operable variable-resistance storage array, and the storage array has two groups of leading-out wires which have the same quantity and are perpendicular to each other; a storage unit is connected between two leading-out wires which are perpendicular to each other and have different serial numbers; each storage unit consists of an electrically operable variable-resistance two-terminal device and a gating diode; and two leading-out wires which are perpendicular to each other and have the same serial numbers are connected by using a controllable switch device only. During writing, all switch devices are turned off to obtain high resistance between leading-out wires having the same serial number, and electrical pulses are applied to the unit between two leading-out wires having the designated serial number to change the resistance value of the unit; and during reading, all switch devices are turned on to obtain low resistance between leading-out wires having the same serial number, and an electrical signal is applied between two leading-out wires having the designated serial number to read out the resistance value. Since current can be transferred between leading-out wires having the same serial number through the switch device during reading, if it is regarded that the serial numbers represent objects and the resistance value represent a relationship between two objects, the chip can simultaneously and comprehensively consider a contribution of an indirect relationship factor during reading and can be used for brain-imitation intelligent application scenarios.

DESCRIPTION OF COMPONENT REFERENCE NUMERALS

Figure 1:
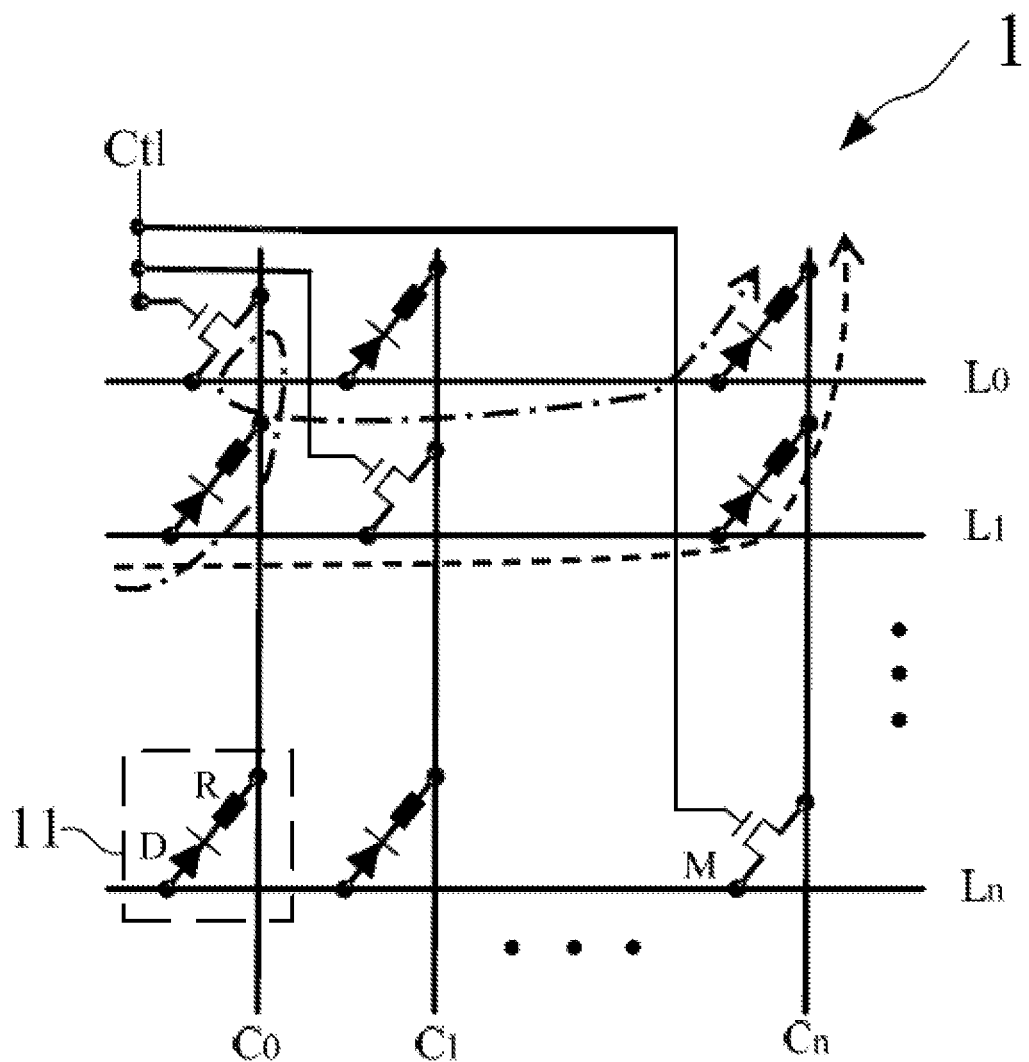
FIG. 1 illustrates a schematic diagram of a storage array provided by the present invention.

1 Storage array
11 Storage unit
111 Upper electrode
112 Variable-resistance material layer
113 Lower electrode
114 P-electrode
115 N-electrode
116 Highly doped buried layer
117 First via
118 Second via
2 Interface module
3 Control module
4 Driving module
5 First decoder
6 Second decoder
7 Clock module
8 Power supply module
S11-S14 Steps
S21-S25 Steps

DETAILED DESCRIPTION OF THE PREFERRED EMBODIMENTS

The implementation modes of the present invention will be described below through specific examples. One skilled in the art can easily understand other advantages and effects of the present invention according to contents disclosed in the description. The present invention may also be implemented or applied through other different specific implementation modes. Various modifications or variations may be made to all details in the description based on different points of view and applications without departing from the spirit of the present invention.

Please refer to FIG. 1 to FIG. 5. It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

As illustrated in FIG. 1, the present invention provides a storage array 1. The storage array 1 comprises:

first leading-out wires and second leading-out wires which have the same quantity and are respectively located in a line direction and a column direction; and the first leading-out wires and the second leading-out wires being respectively numbered. In this embodiment, the first leading-out wires are located in a line direction, the second leading-out wires are located in a column direction, and the directions of the first leading-out wires and the second leading-out wires may be interchangeable and are not limited to this embodiment. In this embodiment, the first leading-out wires are sequentially named as L0-Ln from top to bottom, and the second leading-out wires are sequentially named as C0-Cn from left to right, wherein subscripts 0-n are serial numbers. A storage unit 11 is connected between each first leading-out wire and each second leading-out wire having different serial numbers, and a controllable switch M is connected between each first leading-out wire and each second leading-out wire having a same serial number.

Figure 2:
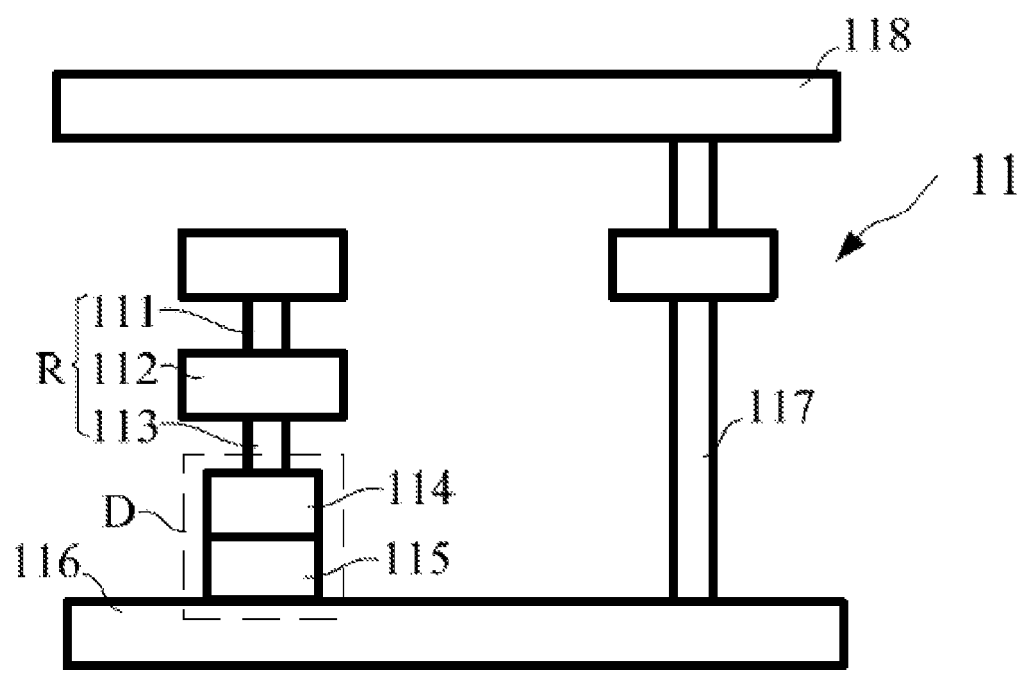
FIG. 2 illustrates a schematic diagram of a storage unit provided by the present invention.

Specifically, as illustrated in FIG. 1, the storage unit 11 comprises a variable-resistance two-terminal device R and a gating diode D which are connected in series, and the gating diode D is forwardly conducted from the first leading-out wire to the second leading-out wire and is reversely cut off from the second leading-out wire to the first leading-out wire. In this embodiment, one end of the variable-resistance two-terminal device R is connected with the second leading-out wire, and another end is connected with a negative electrode of the gating diode D. A positive electrode of the gating diode D is connected with the first leading-out wire. As illustrated in FIG. 2, more specifically, the variable-resistance two-terminal device R comprises a variable-resistance material layer 112, an upper electrode 111 located on the upper surface of the variable-resistance material layer 112, a lower electrode 113 located on the lower surface of the variable-resistance material layer 112, and a silicon dioxide dielectric material layer (not shown) on an outer side; one end of the variable-resistance two-terminal device R is connected with the second leading-out wire through a second via 118, and another end is connected with the gating diode D; and materials of the upper electrode 111 and the lower electrode 113 are materials such as W or TiN with low resistivity, and the material of the variable-resistance material layer 112 may be one or ally of Ge, Sb and Te; preferably, the material of the variable-resistance material layer 112 is alloy of Ge, Sb, Te in a component ratio of 2:2:6. The gating diode D comprises a P-electrode 114 and an N-electrode 115, and the P-electrode 114 is connected with the lower electrode 113 of the variable-resistance two-terminal device R; the N-pole 115 is connected with a highly doped buried layer 116 and is connected with the first leading out wire through a first via 117. The variable-resistance two-terminal device R is capable of changing between at least two resistance values under an effect of an electrical pulse signal, such as a high-resistance state and a low-resistance state; or a resistance value of the variable-resistance two-terminal device R is capable of changing between a maximum resistance value and a minimum resistance value under an effect of an electrical pulse signal according to different intensities and waveforms of electrical exciting signals, wherein the maximum resistance value is higher than the minimum resistance value by at least one magnitude.

Specifically, as illustrated in FIG. 1, the controllable switch M is switched between a bidirectional cut-off state and a unidirectional conducted state from the second leading-out wire to the first leading-out wire, and a control end of each controllable switch M is connected with a same switch control signal Ctl. All controllable switches M are turned off during a write operation, and all controllable switches M are turned on during a read operation.

Figure 3:
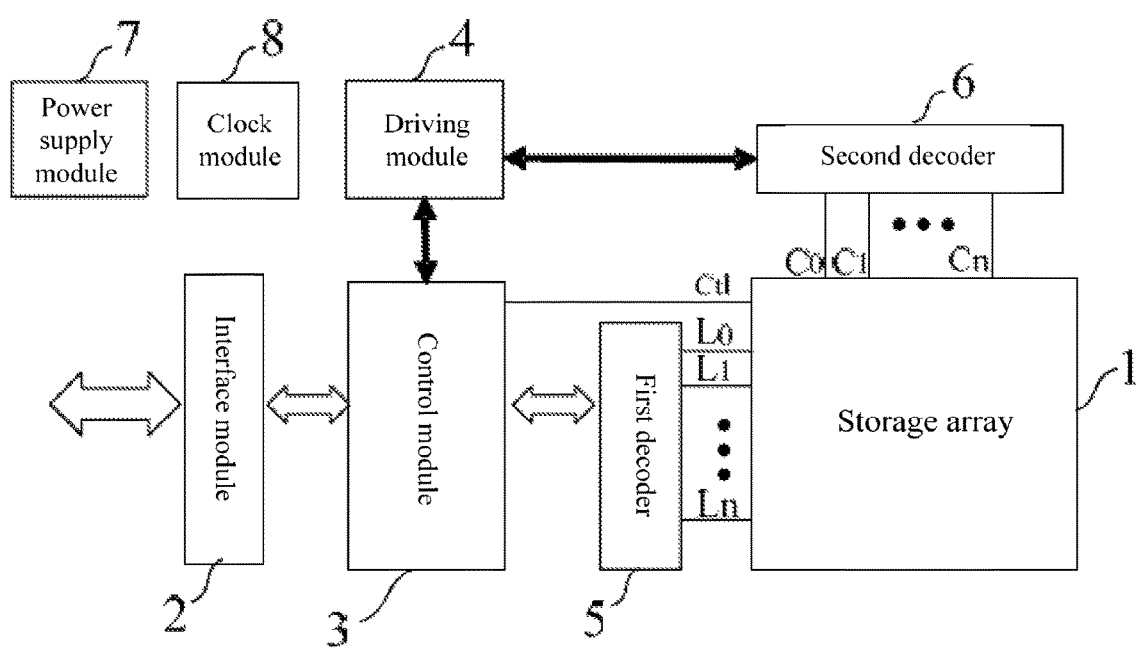
FIG. 3 illustrates a schematic diagram of a storage chip for storing a logic relationship between objects provided by the present invention.

As illustrated in FIG. 3, the present invention further provides a storage chip for storing a logic relationship between objects. The storage chip for storing the logic relationship between objects at least comprises: an interface module 2, a control module 3, a driving module 4, a first decoder 5, a second decoder 6 and the storage array 1.

As illustrated in FIG. 3, the interface module 2 is used for inputting and outputting data.

Specifically, the interface module 2 is used as a channel for information exchange between the storage chip for storing the logic relationship between objects and a peripheral equipment, and any interface module in the prior art is applicable to the storage chip for storing the logic relationship between objects. Data input from the interface module 2 comprises a first object a, a second object b, and a logic relationship value p between the first object a and the second object b. In this embodiment, the first object a is a condition, the second object b is a result and the logic relationship value p is a probability value that the second object b is directly caused to be established when the first object a is established.

As illustrated in FIG. 3, the control module 3 is connected with the interface module 2, the driving module 4 and the first decoder 5 and is used for acquiring an input instruction and producing a corresponding control signal.

Specifically, the control module 3 is bidirectionally connected with the interface module 2, the driving module 4 and the first decoder 5, receives an instruction, and outputs various control signals to perform write, read or erase operations.

As illustrated in FIG. 3, the driving module 4 is connected with the control module 3 and the second decoder 6, and is used for producing write current, erase current or read current according to the control signal output by the control module 3.

Specifically, the amplitude and pulse width of the write current may be produced by the control module 3 according to the intensity of the written logic relationship value.

As illustrated in FIG. 3, the first decoder 5 is connected with the control module 3 and first leading-out wires of the storage array 1 and is used for gating the first leading-out wire corresponding to the first object a under the control of the control module 3.

As illustrated in FIG. 3, the second decoder 6 is connected with the driving module 3 and second leading-out wires of the storage array 1, and is used for gating the second leading-out wire corresponding to the second object b under the control of the control module 3.

As illustrated in FIG. 3, the storage array 1 is respectively connected with the control module 3, the first decoder 5 and the second decoder 6. During a write operation, the storage array 1 turns off all controllable switches under the control of a switch control signal Ctl output by the control module 3, and writes the logic relationship value p between the first object a and the second object b into a storage unit between the gated first leading-out wire and the gated second leading-out wire. During a read operation, the storage array 1 turns on all controllable switches under the control of a switch control signal Ctl output by the control module 3, and reads the logic relationship value p between the first object a and the second object a from a storage unit between the gated first leading-out wire and the gated second leading-out wire.

As illustrated in FIG. 3, the storage chip for storing the logic relationship between objects further comprises a clock module 7 and a power supply module 8, which are respectively used for providing a working clock and power supply voltage.

Figure 4:
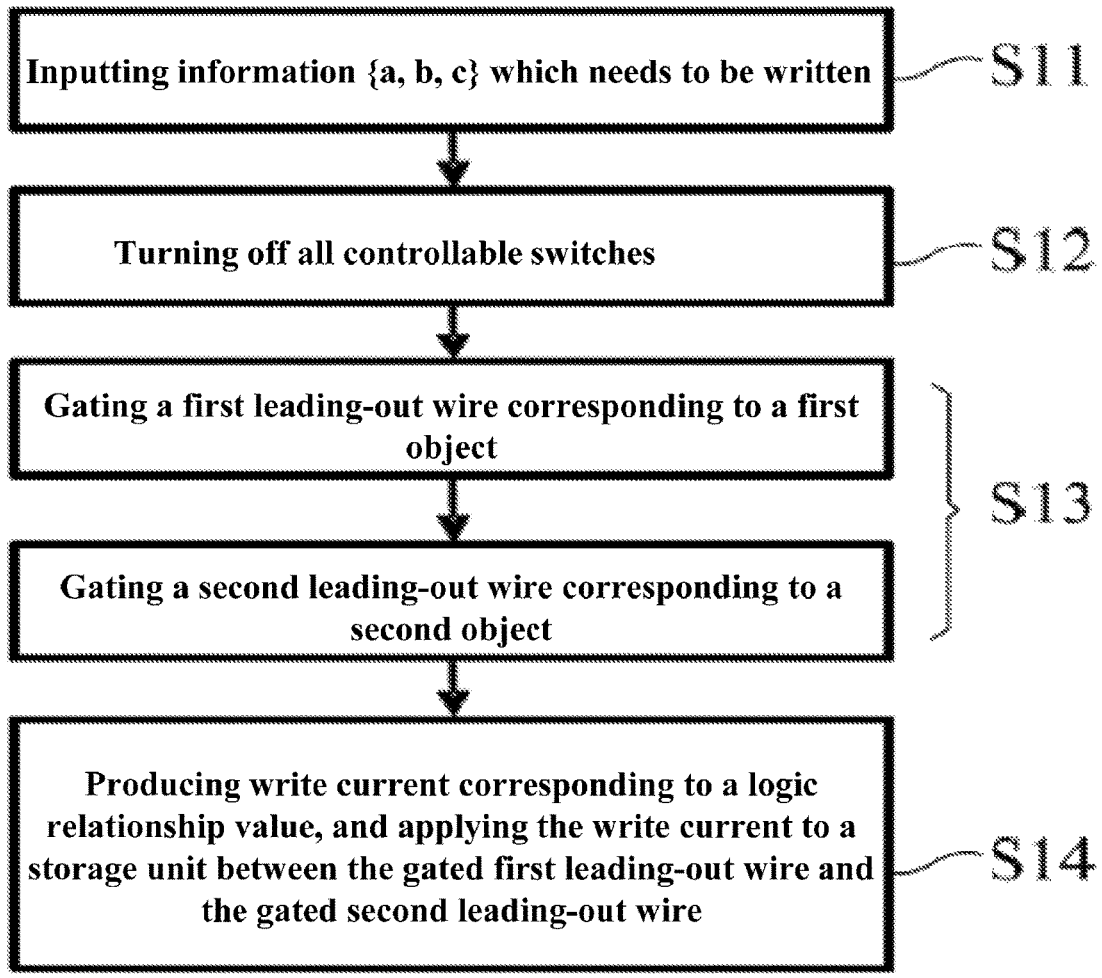
FIG. 4 illustrates a flowchart of a write operation of a storage method for storing a logic relationship between objects provided by the present invention.
Figure 5:
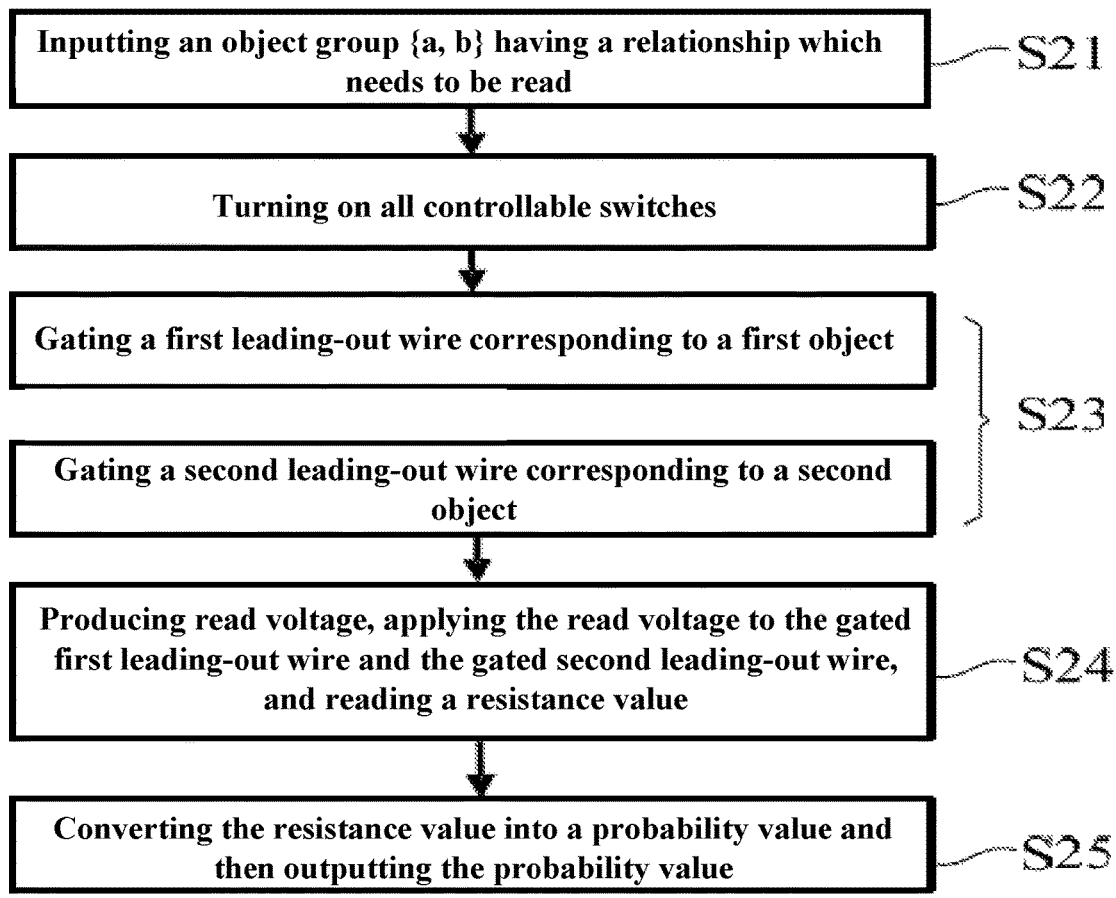
FIG. 5 illustrates a flowchart of a read operation of a storage method for storing a logic relationship between objects provided by the present invention.

As illustrated in FIG. 3 to FIG. 5, the present invention further provides a storage method for storing a logic relationship between objects. The storage method for storing the logic relationship between objects adopts the storage array and at least comprises the following steps:

A write operation, as illustrated in FIG. 4, specifically comprises the following steps:

In step S11: information which needs to be written, including a first object a, a second object b and a logic relationship value p between the first object a and the second object b, is input.

Specifically, information {a, b, c} which needs to be written is given. In this embodiment, the first object a is represented by using a serial number, and the first object a represents a condition; the second object b is represented by using a serial number, and the second object b represents a result; and the logic relationship value represents a probability value that the second object b is directly caused to be established when the first object a is established; wherein a value range of p may be set as [0, 1], 0 represents that the first object a and the second object b do not have any relationship; the establishment of the first object a does not cause the establishment of the second object b at all; 1 represents that the establishment of the first object a inevitably causes the establishment of the second object b; the bigger the value is, the higher the probability of establishment is; and in actual use, the definition of the value range of p may be set according to actual need and is not limited to this embodiment. In this embodiment, the storage chip for storing the logic relationship between objects is adopted to realize the storage of the logic relationship between objects, and thus the information which needs to be written is transmitted to the control module 3 through the interface module 2.

In step S12, all controllable switches in the storage array are turned off

Specifically, after the control module 3 receives the information, the control module 3 outputs a switch control signal Ctl. All controllable switches M in the storage array 1 are turned off, and a high-resistance state is presented between the first leading-out wire and the second leading-out wire having the same serial number.

In step S13, a first leading-out wire corresponding to the first object a is gated, and a second leading-out wire corresponding to the second object is gated.

Specifically, the control module 3 controls the first decoder 5 and the second decoder 6 according to the serial numbers of the first object a and the second object b to gate the corresponding first leading-out wire and the corresponding second leading-out wire. A method for gating the second leading-out wire corresponding to the second object b specifically comprises: grounding the second leading-out wire corresponding to the second object b, and suspending other second leading-out wires or applying a high level to other second leading-out wires to reversely cut off the gating diodes D in unselected storage units 11.

In step S14, write current corresponding to the logic relationship value p between the first object a and the second object b is produced, and the write current is applied to a storage unit between the gated first leading-out wire and the gated second leading-out wire.

Specifically, the control module 3 controls the driving module 4 to produce current corresponding to the logic relationship value p between the first object a and the second object b, and the current is input to the storage unit 11 between the gated first leading-out wire and the gated second leading-out wire through the gated first leading-out wire. Due to the change of current, the resistance value of the variable-resistance two-terminal device R changes. Specifically, the resistance value of the variable-resistance two-terminal device R is capable of changing between at least two resistance values under, or the resistance value of the variable-resistance two-terminal device R is capable of changing between a maximum resistance value and a minimum resistance value according to different intensities and waveforms of electrical exciting signals, wherein the maximum resistance value is higher than the minimum resistance value by at least one magnitude.

Up to now, the logic relationship value p corresponding to the first object a and the second object b has already been written into the storage array 1. In the write operation, the written logic relationship value overwrites an original logic relationship value; or is superposed on the basis of an original logic relationship value. In this embodiment, the superposing method is adopted to enhance a logic relationship between the first object a and the second object b.

A read operation, as illustrated in FIG. 5, specifically comprises the following steps:

In step S21, an object group having a relationship which needs to be read out is input, and the object group comprises the first object and the second object.

Specifically, an object group {a, b} having a relationship which needs to be read out is given. In this embodiment, the first object a is represented by using a serial number, and the first object a represents a condition. The second object b is represented by using a serial number, and the second object b represents a result. In this embodiment, the storage chip for storing the logic relationship between objects is adopted to realize the storage of the logic relationship between objects, and thus the information about the object group having the relationship which needs to be read out is transmitted to the control module 3 through the interface module 2.

In step S22, all controllable switches in the storage array are turned on.

Specifically, after the control module 3 receives the information, the control module 3 outputs a switch control signal Ctl, all controllable switches M in the storage array 1 are turned on, and a low-resistance state is presented between the first leading-out wire and the second leading-out wire having the same serial number.

In step S23, the first leading-out wire corresponding to the first object a is gated and the second leading-out wire corresponding to the second object b is gated.

Specifically, the control module 3 controls the first decoder 5 and the second decoder 6 according to the serial numbers of the first object a and the second object b to gate the corresponding first leading-out wire and the corresponding second leading-out wire. A method for gating the second leading-out wire corresponding to the second object specifically comprises: grounding the second leading-out wire corresponding to the second object b and suspending other second leading-out wires.

In step S24, read voltage or current is produced, the read voltage or current is applied to the gated first leading-out wire and the gated second leading-out wire, and a resistance value between the gated first leading-out wire and the gated second leading-out wire is read out.

Specifically, the control module 3 controls the driving module 4 to produce read voltage or current, the read voltage or current is applied to the gated first leading-out wire and the gated second leading-out wire, wherein a high level is applied to the first leading-out wire and a low level is applied to the second leading-out wire, and current flowing through the first leading-out wire and the second leading-out wire is read out to acquire the resistance value.

More specifically, if the first object a and the second object b have a direct relationship, as illustrated in FIG. 1, in this embodiment, the serial number of the first object a is 1, the serial number of the second object b is n; and the current is input from the gated first leading-out wire L1, flows through the storage unit between the gated first leading-out wire L1 and the gated second leading-out wire Cn, and then is output by the gated second leading-out wire Cn. The resistance value r in the storage unit between the gated first leading-out wire L1 and the gated second leading-out wire Cn is directly read out. The smaller the resistance value r is, the higher the probability p that the second object b is established when the first object a is established is.

More specifically, if the first object and the second object have an indirect relationship through a third object, as illustrated in FIG. 1, in this embodiment, the serial number of the first object a is 1, the serial number of the second object b is n, the serial number of the third object c is 0; the probability that the third object c is directly caused to be established when the first object a is established is p1; the probability that the second object b is directly caused to be established when the third object c is established is p2; the current is input from the gated first leading-out wire L1; since the first object a and the second object b do not have a direct relationship, the storage unit which stores the logic relationship value between the first object a and the second object b presents a high-resistance state, and no current flows through the storage unit; however, since the first object a and the third object c have a direct relationship, the current flows through the storage unit which stores the logic relationship value between the first object a and the third object c; since all controllable switches are turned on, the current flows from the second leading-out wire C0 corresponding to the third object c to the first leading-out wire L0 corresponding to the third object c; the third object c is converted from a result into a condition, thereafter since the third object c and the second object b have a direct relationship, the current flows through the storage unit which stores the logic relationship value between the third object c and the second object b; finally the current is output from the gated second leading-out wire Cn, and the finally objected resistance value is a sum of a resistance value r1 corresponding to the logic relationship value between the first object a and the third object c and a resistance value r2 corresponding to the logic relationship value between the third object c and the second object b. Even though the first object a and the second object b do not have a direct relationship, the logic relationship therebetween may be known through reasoning by means of the indirect relationship, wherein r1+r2 is inevitably greater than the single resistance value r1 or r2, i.e., the probability that the second object b is established when the first object a is established is lower than the probability that the third object c is established when the first object a is established and the probability that the second object b is established when the third object c is established; the smaller the probability p1 that the third object c is established when the first object a is established and the probability p2 that the second object b is established when the third object c is established are, the greater r1+r2 is and the smaller the probability that the second object b is established when the first object a is established is, which complies with logic thinking.

More specifically, if the first object a and the second object b not only have a direct relationship but also have an indirect relationship, the total resistance that the current flows through is the resistance obtained by connecting in parallel the resistances obtained under the above-mentioned two situations, i.e., (r1+r2)//r, and the finally read resistance value is inevitably smaller than the resistance value in any one of the above-mentioned two situations. The probability that the second object b is established when the first object a is established increases, and the logic relationship between the first object a and the second object b is enhanced.

In step S25, the read resistance value is converted into a corresponding logic relationship value, and then the logic relationship value is output.

Preferably, the read resistance value is output to the control circuit 3; the control circuit 3 outputs a corresponding logic relationship value according to the read resistance value; and the logic relationship value is output through the interface circuit 2. A relationship between resistance value and logic relationship values may be linear, may also be nonlinear and may be specifically set according to different actual use scenarios.

Up to now, the logic relationship corresponding to the first object a and the second object b is read out.

The storage array and the storage chip and method for storing the logic relationship between objects provided by the present invention adopt an electrically operable variable-resistance storage array; the storage array has two groups of leading-out wires which have the same quantity and are perpendicular to each other; a storage unit is connected between two leading-out wires which are perpendicular to each other and have different serial numbers; each storage unit consists of an electrically operable variable-resistance two-terminal device and a gating diode; and two leading-out wires which are perpendicular to each other and have the same serial numbers are connected by using a controllable switch device only. During writing, all switch devices are turned off to obtain high resistance between leading-out wires having the same serial number, and electrical pulses are applied to the unit between two leading-out wires having the designated serial number to change the resistance value of the unit; and during reading, all switch devices are turned on to obtain low resistance between leading-out wires having the same serial number, and an electrical signal is applied between two leading-out wires having the designated serial number to read out the resistance value. Since current can be transferred between leading-out wires having the same serial number through the switch device during reading; thus, if it is regarded that the serial numbers represent objects, and the resistance value represent a relationship between two objects, the chip can simultaneously and comprehensively consider a contribution of an indirect relationship factor during reading, and can be used for brain-imitation intelligent application scenarios.

To sum up, the present invention provides a storage array and a storage chip and method for storing a logic relationship between objects. The storage array comprises first leading-out wires and second leading-out wires which have the same quantity and are respectively located in a line direction and a column direction; the first leading-out wires and the second leading-out wires are respectively numbered; a storage unit is connected between each first leading-out wire and each second leading-out wire having different serial numbers; and a controllable switch is connected between each first leading-out wire and each second leading-out wire having a same serial number. The storage chip for storing the logic relationship between objects comprises an interface module, a control module for producing a control signal, a driving module for producing write current, erase current or read current, a first decoder for gating the first leading-out wires, a second decoder for gating the second leading-out wires, and a storage array for storing a logic relationship value. The storage method for storing the logic relationship between objects comprises write and read operations. The storage array and the storage chip and method for storing the logic relationship between objects provided by the present invention realize the storage of the logic relationship between the objects through the brand new storage array; and during reading, by converting a result into a condition through transfer of the controllable switches between the leading-out wires having the same serial numbers and by comprehensively considering an indirect relationship factor accordingly, the present invention can be applied to brain-imitation intelligent application scenarios and the amount of information in the storage array is increased. Therefore, the present invention effectively overcomes various disadvantages in the prior art and thus has a great industrial utilization value.

The above-mentioned embodiments are just used for exemplarily describing the principle and effects of the present invention instead of limiting the present invention. One skilled in the art may make modifications or changes to the above-mentioned embodiments without going against the spirit and the range of the present invention. Therefore, all equivalent modifications or changes made by those who have common knowledge in the art without departing from the spirit and technical concept disclosed by the present invention shall be still covered by the claims of the present invention.

What is claimed is:

1. A storage array, characterized in that the storage array at least comprises:
   first leading-out wires and second leading-out wires which have the same quantity and are respectively located in a line direction and a column direction; the first leading-out wires and the second leading-out wires being respectively numbered; a storage unit being connected between each first leading-out wire and each second leading-out wire having different serial numbers; and a controllable switch being connected between each first leading-out wire and each second leading-out wire having a same serial number, wherein,
   the storage unit comprises a variable-resistance two-terminal device and a gating diode which are connected in series, and the gating diode is forwardly conducted from the first leading-out wire to the second leading-out wire and is reversely cut off from the second leading-out wire to the first leading-out wire; and
   the controllable switch is switched between a bidirectional cut-off state and a unidirectional conducted state from the second leading-out wire to the first leading-out wire.

2. The storage array according to claim 1, characterized in that the variable-resistance two-terminal device is capable of changing between at least two resistance values under an effect of an electrical pulse signal.

3. The storage array according to claim 1, characterized in that a resistance value of the variable-resistance two-terminal device is capable of changing between a maximum resistance value and a minimum resistance value under an effect of an electrical pulse signal according to different intensities and waveforms of electrical exciting signals, wherein the maximum resistance value is higher than the minimum resistance value by at least one magnitude.

4. A storage chip for storing a logic relationship between objects, characterized in that the storage chip for storing the logic relationship between objects at least comprises:
an interface module, a control module, a driving module, a first decoder, a second decoder and the storage array according to claim 1; wherein:
the interface module is used for inputting and outputting data;
the control module is connected with the interface module, the driving module and the first decoder, and is used for acquiring an input instruction and producing a corresponding control signal;
the driving module is connected with the control module and the second decoder, and is used for producing write current, erase current or read current according to the control signal output by the control module;
the first decoder is connected with the control module and first leading-out wires of the storage array, and is used for gating the corresponding first leading-out wire under the control of the control module;
the second decoder is connected with the driving module and second leading-out wires of the storage array, and is used for gating the corresponding second leading-out wire under the control of the control module; and
the storage array is respectively connected with the control module, the first decoder and the second decoder, and is used for turning off all controllable switches under the control of the control module, and writing a logic relationship value into a storage unit between the gated first leading-out wire and the gated second leading-out wire; or turning on all controllable switches under the control of the control module, and reading a logic relationship value from a storage unit between the gated first leading-out wire and the gated second leading-out wire.

5. The storage chip for storing the logic relationship between objects according to claim 4, characterized in that the gated first leading-out wire represents a first object as a condition; the gated second leading-out wire represents a second object as a result; the logic relationship value is a probability value that the second object is directly caused to be established when the first object is established, and the first leading-out wire and the second leading-out wire having a same serial number correspond to a same object.

6. A storage method for storing a logic relationship between objects, characterized in that the storage method for storing the logic relationship between objects adopts the storage array according to claim 1, and at least comprises the following steps:
write operation:
inputting information which needs to be written, including a first object, a second object and a logic relationship value between the first object and the second object;
turning off all controllable switches in the storage array;
gating a first leading-out wire corresponding to the first object and gating a second leading-out wire corresponding to the second object; and
producing write current corresponding to the logic relationship value between the first object and the second object, and applying the write current to a storage unit between the gated first leading-out wire and the gated second leading-out wire; and
read operation:
inputting an object group having a relationship which needs to be read out, the object group comprising the first object and the second object;
turning on all controllable switches in the storage array;
gating the first leading-out wire corresponding to the first object and gating the second leading-out wire corresponding to the second object;
producing read voltage or current, applying the read voltage or current to the gated first leading-out wire and the gated second leading-out wire, and reading a resistance value between the gated first leading-out wire and the gated second leading-out wire; and
converting the read resistance value into a corresponding logic relationship value and then outputting the logic relationship value.

7. The storage method for storing the logic relationship between objects according to claim 6, characterized in that the first object is a condition, the second object is a result and the logic relationship value is a probability value that the second object is directly caused to be established when the first object is established.

8. The storage method for storing the logic relationship between objects according to claim 6, characterized in that, in the write operation, the written logic relationship value overwrites an original logic relationship value; or is superposed on the basis of an original logic relationship value to enhance a logic relationship between the first object and the second object.

9. The storage method for storing the logic relationship between objects according to claim 6, characterized in that, in the read operation, if the first object and the second object have a direct relationship, and a resistance value corresponding to the logic relationship value between the first object and the second object is directly read out; if the first object and the second object have an indirect relationship through a third object, a sum of a resistance value corresponding to a logic relationship value between the first object and the third object and a resistance value corresponding to a logic relationship value between the third object and the second object is read out; and if the first object and the second object not only have a direct relationship but also have an indirect relationship through the third object, a resistance value obtained by connecting in series the resistance value corresponding to the logic relationship value between the first object and the third object with the resistance value corresponding to the logic relationship value between the third object and the second object and then connecting with the resistance value corresponding to the logic relationship value between the first object and the second object in parallel is read out.

10. The storage method for storing the logic relationship between objects according to claim 6, characterized in that, in the write operation, a method for gating the second leading-out wire corresponding to the second object comprises: grounding the second leading-out wire corresponding to the second object, and suspending other second leading-out wires or applying a high level to other second leading-out wires to reversely cut off the gating diodes in unselected storage units.

11. The storage method for storing the logic relationship between objects according to claim 6, characterized in that, in the read operation, a method for gating the second leading-out wire corresponding to the second object comprises: grounding the second leading-out wire corresponding to the second object and suspending other second leading-out wires.

* * * * *